United States Patent

Reed et al.

[11] 4,084,070
[45] Apr. 11, 1978

[54] OVERCURRENT PROTECTION CIRCUIT

[75] Inventors: Lamar Nelson Reed, Cherry Hill; Jacob Richard Khalifeh, Mount Laurel, both of N.J.

[73] Assignee: RCA Corporation, New York, N.Y.

[21] Appl. No.: 761,448

[22] Filed: Jan. 21, 1977

[51] Int. Cl.² .................... H03K 17/26; H04L 25/02
[52] U.S. Cl. .................................. 178/69 G; 307/294
[58] Field of Search .......................... 178/69 G, 69 R; 307/293, 294; 317/33 R; 340/248 C, 248 E, 248 P

[56] References Cited

U.S. PATENT DOCUMENTS

| | | | |
|---|---|---|---|
| 3,317,668 | 5/1967 | Johnsen | 178/69 G |
| 3,887,824 | 6/1975 | Blauert et al. | 178/69 G |

*Primary Examiner*—Thomas A. Robinson

*Attorney, Agent, or Firm*—H. Christoffersen; Samuel Cohen; Carl V. Olson

[57] ABSTRACT

A circuit for protecting a TELEX line driver from damage due to overcurrent caused by a short circuit on the communications line. Two transistors are connected to form a monostable circuit having an input coupled across a resistor in the current path of the line driver. When current in the line driver exceeds a safe threshold value, the monostable circuit is triggered into a relatively long timed state during which the output of the monostable circuit inhibits conduction in the line driver. When the monostable circuit returns to its stable state, the line driver conducts for a short time until the monostable circuit is again triggered. Conduction in the line driver has a protective low duty cycle until the short circuit is removed and normal operation is automatically resumed.

6 Claims, 1 Drawing Figure

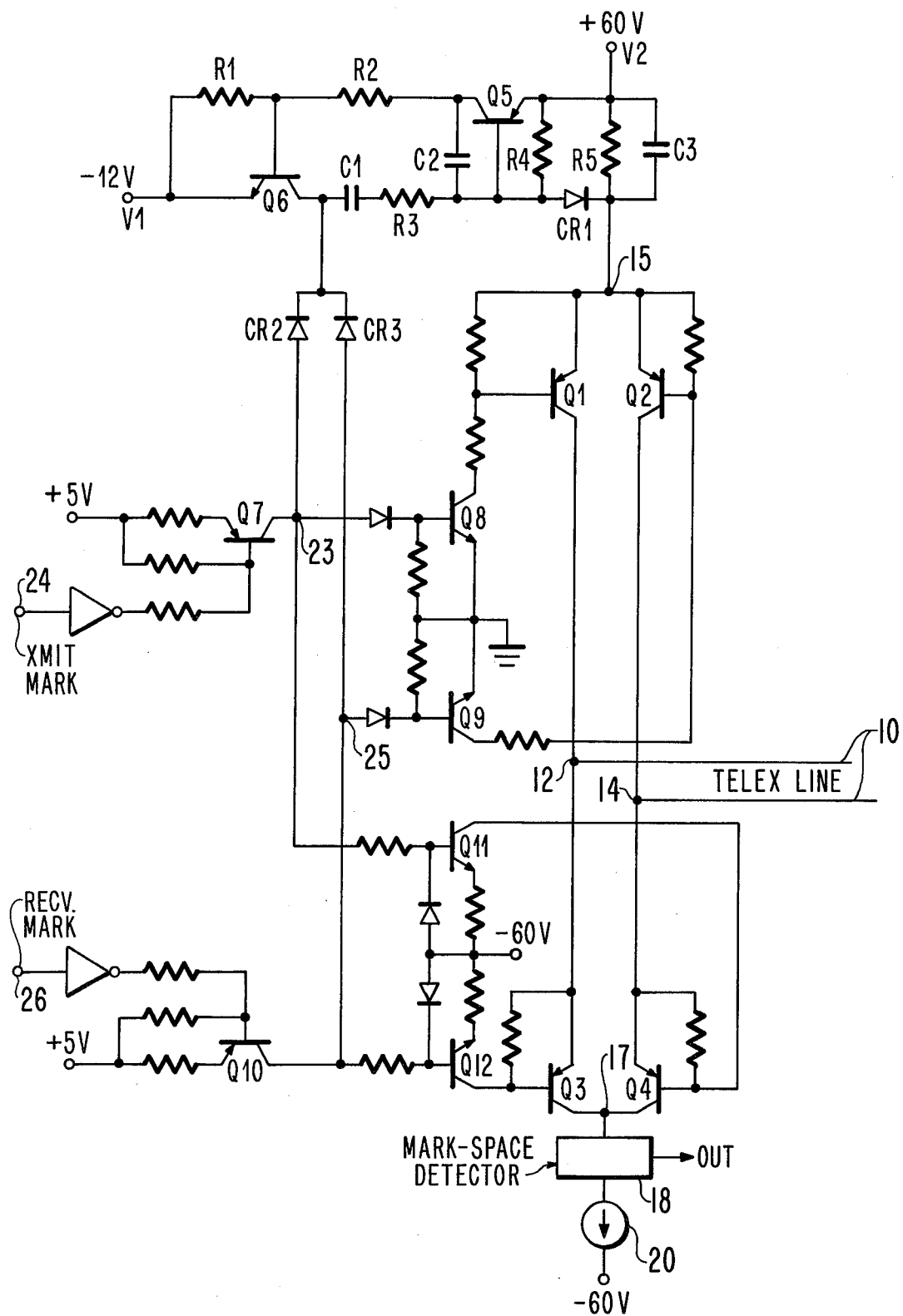

OVERCURRENT PROTECTION CIRCUIT

The invention relates to communications systems, and is particularly useful when applied to telegraphic systems of the TELEX type.

In systems of the above type subscribers communicate with each other by means of teletypewriter machines connected together over telegraph lines. Signals are sent over the lines by means of the line driver circuits which are typically designed to appear as 40 milliampere constant-current sources operating between a pair of relatively high voltage power supplies of ± 60 volts dc. On long lines, most of the available voltage is dropped across the resistance of the line. On short lines, the excess voltage is dropped across the constant current source of the driver. Many TELEX lines pass through distribution panels where maintenance personnel are frequently making changes. The lines are thus prone to accidental shorts to ground which frequently cause the burning out of the output transistors of line drivers connected to the shorted lines.

According to an embodiment of the invention, a line driver is protected from damage due to short circuits on the communications line by a monostable circuit constructed and connected to respond to excessive current in the line driver by repeatedly turning the line driver off for relatively long periods of time, and allowing the line driver to be on for only very short intermediate periods of time.

The sole FIGURE of the drawing is a circuit diagram of a TELEX line driver and a monostable circuit constructed and connected to protect the line driver from damage due to a short circuit on the line.

In the drawing, a TELEX subscriber wire line 10 is shown going to the right to a remote terminal (not shown) where the line is connected to a teletypewriter. The local end of the line 10 is connected at 12 and 14 to diagonals of a bridge circuit including transistors Q1, Q2, Q3 and Q4. A third bridge circuit terminal 15 is connected through a resistor R5 to the ±60 volt terminal of a direct current power supply. A fourth terminal 17 of the bridge is connected through a mark-space detector 18 and a constant current device 20 to the −60 volt terminal of the direct current power supply.

Transistor Q1 is connected to be rendered conductive by means of an input circuit including transistor Q8. Transistor Q4 is connected to be rendered conductive by the circuit of transistor Q11. The circuits of transistors Q8 and Q11 are both arranged to be energized from the circuit of a transistor Q7, which is in turn activated by a signal applied to a transmit mark terminal 24. When a signal is applied to terminal 24, transistors Q1 and Q4 are rendered conductive (as discussed later) to permit current to flow in a path from the +60 volt power supply terminal through transistor Q1, and out the upper conductor of the TELEX line 10, and in on the lower conductor of TELEX line 10 to terminal 14 and thence through transistor Q4 and the mark-space detector 18 to the −60 volt terminal of the power supply.

In a similar manner, transistor Q2 is rendered conductive by the circuit of transistor Q9 from the circuit of transistor Q10 when a receiver mark signal is applied to signal input terminal 26. At the same time, the transistor Q3 is rendered conductive from the circuit of transistor Q12 under the control of the circuit of transistor Q10 in response to the signal applied to terminal 26. In this case, the current flow from the +60 volt power supply terminal is down through transistor Q2 to terminal 14 and out the TELEX line 10. Current also flows in from the TELEX line 10 to the terminal 12 and down through the transistor Q3 and the mark-space detector 18.

In the event of a short circuit on the TELEX line 10, the current flow from the line 10 and through the transistors Q3 and Q4 is not excessive because of the current limiting effect of the constant current device 20. On the other hand, an excessive current may flow through the transistors Q1 and Q2, and they may be burned out by excessive current flowing through the transistors into the TELEX line 10 to the short circuit thereon. What has thus far been described is a conventional TELEX line driver circuit which is in widespread use throughout the world. The circuit for protecting the line driver from damage will now be described.

The upper part of the drawing shows a bistable circuit including a first normally non-conducting transistor Q5 and a second normally non-conducting transistor Q6. The transistor Q5 has an emitter-base input circuit connected across a resistor R4. The base of transistor Q5 is connected to the anode of diode $CR_1$ and the cathode of this diode is connected to the terminal 15 of the bridge circuit of the line driver. The emitter of transistor Q5 is connected to the +60 volt terminal and resistor R5 is connected between this terminal and terminal 15. The transistor Q5 is normally non-conducting and the value of resistor R5 is selected so that when an excessive current flows through the resistor, a voltage is developed thereacross which is sufficient to exceed the sum of the forward voltage of diode CR1 and the base-emitter voltage necessary to render transistor Q5 conductive.

The resistor R4 provides a path for collector-base leakage current. A capacitor C3 is connected across the resistor R5 and is required because of the distributed capacity of the TELEX wire line. The value of the capacitor C3 is selected so that it can provide sufficient current to charge the TELEX line distributed capacity prior to the time that the voltage across the capacitor increases to a level which will cause a sensing of excessive current, when current is switched into the line 10.

A capacitor C2 is connected across the collector and base electrodes of transistor Q5. The collector of transistor Q5 is connected through a resistor R2 to the base of the second normally non-conducting transistor Q6, and on through resistor R1 to the emitter of transistor Q6. The collector of transistor Q6 is coupled through a capacitor C1 and a resistor R3 in a feedback path back to the base of the transistor Q5. The collector of transistor Q6 is also connected through a diode CR2 to the junction point 23 at the collector of transistor Q7. Similarly, the collector of transistor Q6 is connected through the diode CR3 to the junction point 25 at the collector of transistor Q10.

The capacitor C2 is selected at the value which will give the monostable circuit a suitably long time state. The capacitor determines how long transistors Q5 and Q6 are kept conducting following triggering of the monostable circuit by a voltage across resistor R5 exceeding a predetermined threshold value.

The diode CR1 is provided for the purpose of isolating resistor R5 from the base of transistor Q5 when capacitor C2 is providing base current to transistor Q5. Resistor R1 provides a path for the collector-base leakage current of transistor Q6. Resistor R2 limits the base drive current to transistor Q6. Resistor R3 is required on power turn-on of the power supplies to limit the charging current of capacitor C1 to a value that is safe for transistors Q5 and Q6. The value of capacitor C1 is selected so that the charge transfer from capacitor C1 to capacitor C2 during the detection of excess current will be sufficient to drive transistor Q5 into saturation. This condition will occur for the ratios: $C1/C2 \geq V2/V1$.

In the operation of the TELEX line driver shown in the drawing, a transmit mark signal applied to input line terminal 24 causes transistor Q7 to conduct, which in turn causes transistor Q8 to conduct, which in turn causes transistor Q1 to conduct a current from the +60 volt power supply terminal to and through terminal 12 to the upper conductor of TELEX line 10. In a similar manner, a received mark signal applied to input line terminal 26 causes transistor Q10 to conduct, which in turn causes transistor Q9 to conduct, which in turn causes transistor Q2 to conduct and pass a current from the +60 volt power supply terminal to the terminal 14 on the lower conductor of the TELEX line 10. If, when either of these currents are being fed to the TELEX line 10, there is a short circuit on the line, the amount of current passed through transistor Q1 or transistor Q2 (in the absence of the present protective circuit) may exceed the power rating of the transistor and cause it to burn out. Such burnout is prevented here by the protective action of the monostable circuit including normally non-conducting transistors Q5 and Q6.

When the current drawn through resistor R5 by transistor Q1 or Q2 exceeds a predetermined threshold value, the voltage developed across resistor R5 causes conduction through the path comprising the base-emitter path of normally non-conducting transistor Q5 and the diode CR1, thereby rendering the transistor conductive. When the transistor Q5 conducts, its collector current drives the base electrode of transistor Q6, causing transistor Q6 to also conduct. When transistor Q6 also conducts, it supplies a positive feedback through capacitor C1 and resistor R3 to the base of transistor Q5 which acts to speed up the turning on of both of the transistors Q5 and Q6.

When transistor Q6 is conductive, its collector electrode draws current through diode CR2 from transistor Q7. The current drawn from transistor Q7 is the current that was previously passing onto the circuit of transistor Q8 and was making transistor Q1 conduct. The current diverted to the monostable circuit from the input circuit of the line driver causes the line driver to be turned off. Line driver transistor Q1 is thus rendered non-conductive.

While the line driver transistor Q1 is non-conductive, the monostable circuit remains in its timed state with both transistors (Q5 and Q6) conducting for a period of time required for capacitor C2 to slowly discharge providing current to the base of transistor Q5. When the capacitor is sufficiently discharged, the transistor Q5 ceases to conduct and then transistor Q6 also turns off. Now the transmit mark signal current from transistor Q7 is no longer diverted to the monostable circuit, and the line driver transistor Q1 is turned on. p If the short circuits still exist on the TELEX line 10, the transistor Q1 again immediately draws an excessively large current. However, the excessive current is drawn for only a very short period of time until the monostable circuit is again triggered into its timed state. It is thus apparent that the monostable circuit keeps the line driver turned off for a relatively long period of time, and allows the line driver to be conductive for only very short periods of time. The circuit oscillates between these conditions of conduction and non-conduction, but the circuit time constants are such that the percentage of time which the line driver conducts, is sufficiently small so that there is no damage to the line driver transistor.

The line driver circuit is thus fully protected from damage due to overcurrent, and, when the short circuit or other defect on the TELEX line 10 is removed, the monostable protection circuit restores the circuit to its original operative condition without the need for any human intervention for this purpose. The monostable circuit remains in its normal non-conductive condition until the need may again arise to protect the line driver from overcurrent damage.

The description of how the line driver transistor Q2 is protected applies similarly to the manner in which the transistor Q2 is protected; the protection being afforded at the time when a receiver mark signal is applied to the receive mark input terminal 26.

What is claimed is:

1. In a signaling system in which a line driver supplies a signaling current to a communications line, means to protect said line driver from damage due to a short circuit on the line, comprising a monostable circuit having an input circuit coupled to said line driver to be triggered into a relatively long timed state when the current through the driver exceeds a safe threshold value, and having an output circuit coupled to said line driver to inhibit conduction in the line driver during the timed state of said monostable circuit, whereafter excessive conduction can resume in said line driver for only a very short time before the monostable circuit is again triggered and inhibits the line driver for a relatively long time.

2. Means as defined in claim 1 wherein said line driver includes a resistor effectively in series with the current path to said communications line.

3. Means as defined in claim 2 wherein said monostable circuit includes a first normally non-conducting transistor having input electrodes coupled across said resistor to render the transistor conductive when the current through said line driver exceeds a safe threshold value.

4. Means as defined in claim 3 wherein said monostable circuit includes a second normally non-conducting transistor coupled to the first transistor to be rendered conductive by conduction in the first transistor.

5. Means as defined in claim 4 wherein said second transistor includes an output circuit coupled to said line driver to inhibit conduction in the line driver when the second transistor is conductive.

6. In a system which includes a transmission line comprising two conductors, a driver transistor connected to one of the lines for supplying a signaling current thereto and a driver transistor connected to the other of the lines for supplying a signaling current thereto, and in which, when there is a short on the line, excessive current may flow through the one of these transistors which is on, a circuit for protecting this transistor comprising, in combination:

a monostable circuit of the type which switches from its stable state to a second state in response to an enabling signal and which returns to first state after a given time interval, the given time interval being much longer than the time, after the occurence of an enabling signal, for the monostable circuit to switch to its second state;

means responsive to a flow of current of greater than a given amplitude through the one of said transistors which is on for supplying an enabling signal to said monostable circuit; and means responsive to said monostable circuit, when the latter is in its second state, for turning off the one of said transistors which is on.

* * * * *